United States Patent [19]

Ickes et al.

[11] 4,055,794
[45] Oct. 25, 1977

[54] BASE DRIVE REGULATOR

[75] Inventors: Charles M. Ickes, Chula Vista; Eugene T. Perusse, San Diego, both of Calif.

[73] Assignee: Rohr Industries, Incorporated, Chula Vista, Calif.

[21] Appl. No.: 684,752

[22] Filed: May 10, 1976

[51] Int. Cl.² .............................................. G05F 1/56
[52] U.S. Cl. .................................. 323/22 T; 307/300; 323/DIG. 1
[58] Field of Search ................. 307/202 R, 237, 254, 307/300; 321/2, 12, 13; 323/17, 19, 22 T, DIG. 1

[56] References Cited

U.S. PATENT DOCUMENTS

| | | | |
|---|---|---|---|
| 3,160,765 | 12/1964 | Krossa | 307/300 |
| 3,317,817 | 5/1967 | Gershen | 323/22 T |
| 3,609,398 | 9/1971 | Kronlage | 307/300 X |
| 3,676,713 | 7/1972 | Wiedmann | 307/300 |
| 3,845,405 | 10/1974 | Leidich | 307/300 X |

Primary Examiner—A. D. Pellinen
Attorney, Agent, or Firm—Patrick J. Schlesinger; Frank D. Gilliam

[57] ABSTRACT

A base drive regulator for regulating the base drive voltage of the output transistor of a switching amplifier. The inputs of a comparator are separately connected to a reference voltage of either an independent source or the base of the output transistor and to a resistor network connected between the collector and emitter of the transistor. The output from the comparator is utilized to indirectly control the conductivity of the output transistor to maintain the output transistor just at saturation.

11 Claims, 5 Drawing Figures

BASE DRIVE REGULATOR

BACKGROUND OF THE INVENTION

This invention relates generally to switching amplifiers and more specifically to controlling output transistor saturation.

There are various switching amplifiers utilized for controlling large output currents for the control and operation of various large electrical equipment, such as linear induction motors where the load current and frequency are varied over a large range.

The efficiency of these devices depends on the efficiency of the output of the amplifier. Commonly available circuitry does not operate at maximum efficiency in that there is no control means for preventing the collector voltage of the output transistor from reaching a level less than the level of the base voltage and thus driving the transistor into saturation. This condition increases the power loss within the transistor by increasing its switching time.

A switching amplifier with an output transistor that could be maintained just at saturation at all times regardless of changing loads would find considerable commercial acceptance to improve its efficiency and reduce average drive power requirements.

SUMMARY OF THE INVENTION

The present invention obtains the various benefits of the prior art devices with an improvement in efficiency by increasing switching speeds and reducing base drive power requirements when at low output current or in free wheeling motion.

An object of this invention is to control the base voltage level of an output transistor so that the transistor operates just at the edge of saturation independent of load current.

Another object of this invention is to improve the switching speed of an output transistor without limiting output power.

The above and other specific features of the instant invention will be readily apparent as the description continues while being read in conjunction with the appended drawings.

DETAILED DESCRIPTION OF THE FIRST EMBODIMENT

Thoroughout the drawings and specifications, the same numerals are used in the various figures to denote identical elements or parts.

Figure 1:
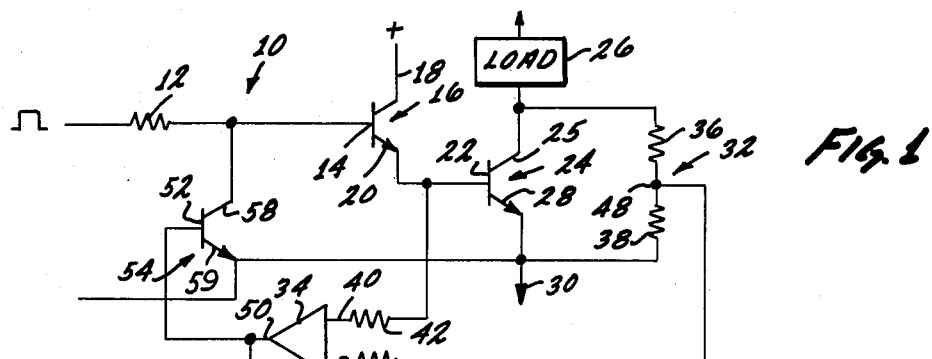
FIG. 1 is a schematic showing of one embodiment of the invention.

Referring now specifically to FIG. 1, an electronic circuit 10 incorporating one embodiment of the base drive regulator is shown. An input resistor 12 for impedance matching of the input signal to the base 14 of transistor 16 is connected between the input signal and the base 14 of the transistor 16. The value of resistor 12 is selected according to the base drive signal producing device (not shown), characteristic of transistor 16, and the power and voltage level at which the selected switched transistor 24 is rated, a typical value would be in the range of from 1 to 1000 ohms.

The transistor 16 is connected in a conventional manner. A positive voltage is applied to collector 18 from a voltage source. The collector supply voltage is typically 10V DC. The emitter 20 of transistor 16 is connected to the base 22 of output power transistor 24. Transistor 16 is typically a 2N5192 or equivalent when transistor 24 is a Motorola BU108 or equivalent. The specific transistors are not a limiting factor, for various transistor combinations may be used for various output power requirements without changing the concept of the invention.

The collector 25 of transistor 24 is connected through series load 26 to a power supply, not shown. The voltage of this power supply of the preferred embodiment is typically 250 V DC. Other voltage values ranging from 12 to 500 V may be used for different transistors and applications. The emitter 28 of transistor 24 is returned to the collector 25 power supply negative potential through lead 30. A voltage divider 32 is connected between the collector 25 and the emitter 28 of the last mentioned transistor. The purpose of the voltage divider is to reduce the collector voltage sample to a value readily handled by the comparator 34, hereinafter discussed. The divider shown is comprised of a pair of resistors 36, 38, in series having a typical value of 50K ohm and 1K ohm respectively. As a general rule, different values will be used for different transistors but a ratio of 50 to 1 is typical.

Comparator 34 has input 40 connected through current limiting resistor 42 to base 22 of transistor 24. A second input 44 is supplied through a second current limiting resistor 46 to tie point 48, between the two aforementioned voltage divider resistors. The output 50 of comparator 34 is connected to the base 52 of regulator transistor 54. One input and the output of the comparator is shunted by a resistor 56 for controlling the gain of the comparator. Resistor 56 may be typically 200K ohm for a Motorola MC 741SC operational amplifier used as a comparator 34. Other operational amplifiers similar in operation to the one noted may require various different values of gain resistors.

Regulator transistor 54 of the embodiment shown is either a type 2N2222 or a type MJE 200 manufactured by various companies or the equivalent may be utilized for this function. The collector 58 is connected to the output side of impedance matching resistor 12 and is common with the base 14 of transistor 16. The emitter 28 is connected to the common power supply returns.

DESCRIPTION OF THE SECOND EMBODIMENT

Figure 2:
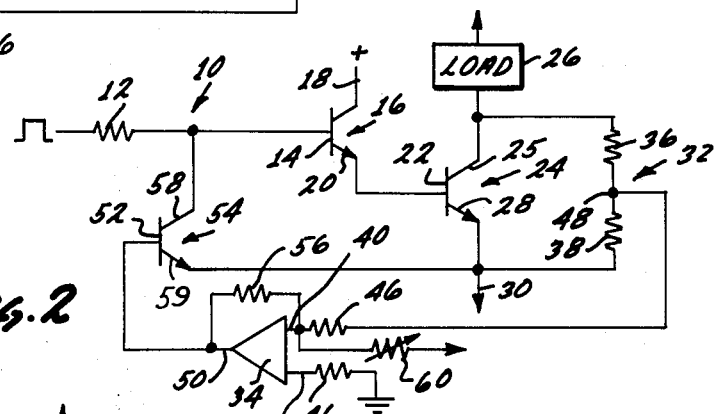
FIG. 2 is a schematic showing of a second embodiment of the invention.

The FIG. 2 showing of the regulator circuit is similar to the FIG. 1 showing except in the source of the voltage input signal to the comparator 34.

Input 40 of the comparator is connected through a series resistor 60 whose resistance is variable through a range of 10 to 10K ohms to a reference voltage of fixed level. A connection from 48 of voltage divider 32 is also connected to input 40 through resistor 46. Input 44 is connected to common through resistor 62.

DESCRIPTION OF THE THIRD EMBODIMENT

Figure 3:
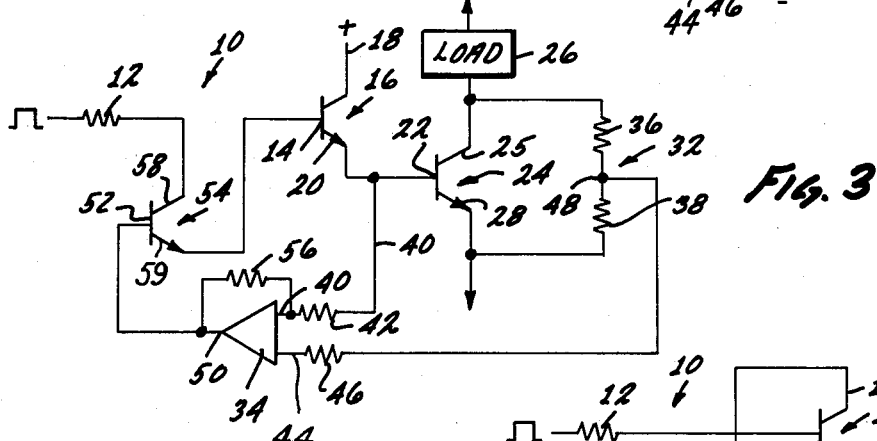
FIG. 3 is a schematic showing of a third embodiment of the invention.

The FIG. 3 embodiment is like the FIG. 1 embodiment except the collector 58 and emitter 59 of regulator transistor 54 are connected between the input resistor 12 and the base 14 of transistor 16.

DESCRIPTION OF THE FOURTH EMBODIMENT

Figure 4:
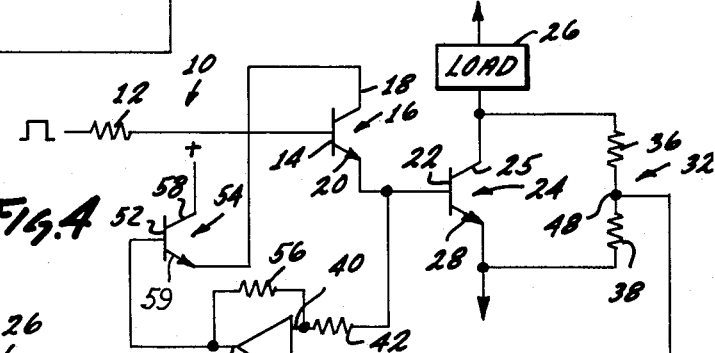
FIG. 4 is a schematic showing of a fourth embodiment of the invention.

The FIG. 4 embodiment is like the FIG. 1 embodiment except the collector 58 and the emitter 59 of regulator transistor 54 are connected between the supply voltage to transistor 16 and its collector 18.

DESCRIPTION OF THE FIFTH EMBODIMENT

Figure 5:
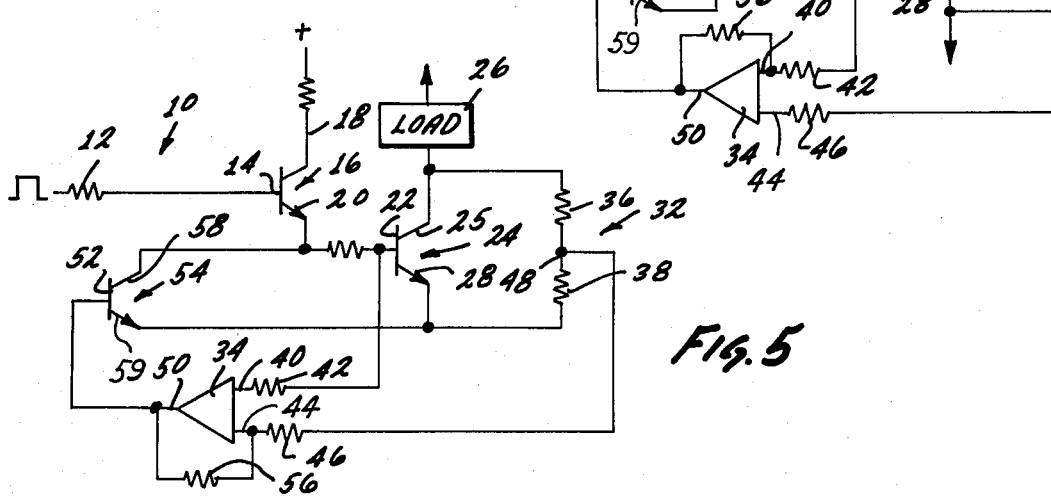
FIG. 5 is a schematic showing of a fifth embodiment of the invention.

The FIG. 5 embodiment is like the FIG. 1 embodiment except the collector 58 and emitter 59 of regulator transistor 54 are connected between a common point of emitter 20 of transistor 16 and the base 22 of power transistor 24.

DESCRIPTION OF THE OPERATION OF THE FIRST EMBODIMENT

The purpose of the regulator is to prevent the collector voltage of the power transistor 24 from reducing to a value less than the voltage at the base thereby preventing saturation of the transistor.

The regulator and the circuit to be regulated are powered in a conventional manner by the application of voltages to the various components at levels typical for their normal operation.

In normal operation without base drive regulation a signal is applied to the resistor 12. A typical signal would be a positive going square wave signal of constant or varying frequency. As the input signal goes positive, the positive signal is applied to the base element 14 of the first transistor 16 causing transistor 16 to conduct positive voltages from its collector to its emitter at a level corresponding to the input level on base 4. The positive signal on emitter 20 is likewise present at the base 22 of the power transistor 24. This voltage causes current to flow through load 26 from the positive supply through the collector 25 and emitter 28 of transistor 24 to the negative supply or common. As transistor 24 conducts, the voltage level at the collector 25 decreases according to the conduction level of the transistor 24. As the voltage on the base 22 increases, the voltage on collector 25 decreases. When the base drive increases to a maximum level, the voltage on collector 25 approaches zero thereby driving the transistor 24 well into saturation.

To prevent the power transistor 24 from going into saturation, the regulator controls the collector voltage in the following manner. The voltage level at the collector 25 is fed through appropriate dropping resistors where it is reduced to a level acceptable by an operational amplifier acting as a comparator. This collector voltage is compared with the base voltage level of the power transistor 24. When the base voltage is less than the collector voltage, the output level of the comparator is insufficient to turn on transistor 54; therefore, the path through transistor 54 is open and the entire input drive signal current is applied to the base of transistor 16. As the collector voltage of transistor 24 approaches the base voltage, the output signal from the comparator increases in value causing transistor 54 to start to conduct, thereby providing a second current path through the transistor. This second current path causes a reduction of voltage level at base 14 resulting in lowering the conduction of transistor 16 which in turn lowers the base voltage on transistor 24, reducing its conductivity and increasing the collector voltage level. The feed back control provides a dynamic control of the saturation of the power output transistor.

DESCRIPTION OF THE OPERATION OF THE SECOND EMBODIMENT

The purpose of the regulator is to prevent the collector voltage of the power transistor 24 from reducing to a value less than the reference voltage applied to the variable resistor element 60 thereby preventing saturation of the transistor to a level below that variable reference voltage. The reference voltage range would typically be .7 volts to 5 volts depending on the type transistor 24 used.

The regulator and the circuit to be regulated are powered in a conventional manner by the application of voltages to the various components at levels typical for their normal operation.

In normal operation without base drive regulation a signal is applied to the resistor 12. A typical signal would be a positive going square wave signal of constant or varying frequency. As the input signal goes positive, the positive signal is applied to the base element 14 of the first transistor 16 causing transistor 16 to conduct positive voltages from its collector to its emitter at a level corresponding to the input level on base 14. The positive signal on emitter 20 is likewise present at the base 22 of the power transistor 24. This voltage causes current to flow through load 26 from the positive supply through the collector 25 and emitter 28 of transistor 24 to the negative supply or common. As transistor 24 conducts, the voltage level at the collector 25 decreases according to the conduction level of the transistor 24. As the voltage on the base 22 increases, the voltage on collector 25 decreases. When the base drive increases to a maximum level, the voltage on collector 25 approaches zero thereby driving the transistor 24 well into saturation.

To prevent the power transistor 24 from going into saturation, the regulator controls the collector voltage in the following manner. The voltage level at the collector 25 is fed through appropriate dropping resistors where it is reduced to a level acceptable by an operational amplifier acting as a comparator. This collector voltage is compared with the reference voltage applied to the variable resistor element 60 of the comparator amplifier 34. When the reference voltage is less than the collector voltage, the output level of the comparator is insufficient to turn on transistor 54; therefore, the path through transistor 54 is open and the entire input drive signal current is applied to the base 14 of the transistor 16. As the collector voltage of transistor 24 approaches the reference voltage, the output signal from the comparator increases in value causing transistor 54 to start to conduct, thereby providing a second current path through the transistor. This second current path causes a reduction of voltage level at base 14 resulting in lowering the conduction of transistor 16 which in turn lowers the base voltage on transistor 24, reducing its conductivity and increasing the collector voltage level. The feed back control provides a dynamic control of the saturation of the power output transistor.

DESCRIPTION OF THE OPERATION OF THE THIRD EMBODIMENT

The purpose of the regulator is to prevent the collector voltage of the power transistor 24 from reducing to a value less than the voltage at the base thereby preventing saturation of the transistor.

The regulator and the circuit to be regulated are powered in a conventional manner by the application of voltages to the various components at levels typical for their normal operation.

In normal operation without base drive regulation a signal is applied to the resistor 12. A typical signal would be a positive going square wave signal of constant or varying frequency. As the input signal goes positive, the positive signal is applied to the base element 14 of the first transistor 16 through transistor 54 in its conducting state causing transistor 16 to conduct positive voltages from its collector to its emitter at a level corresponding to the input level on base 14. The positive signal on emitter 20 is likewise present at the base 22 of the power transistor 24. This voltage causes current to flow through load 26 from the positive supply through the collector 25 and emitter 28 or transistor 24 to the negative supply or common. As transistor 24 conducts, the voltage level at the collector 25 decreases according to the conduction level of the transistor 24. As the voltage on the base 22 increases, the voltage on collector 25 decreases. When the base drive increases to a maximum level, the voltage on collector 25 approaches zero thereby driving the transistor 24 well into saturation.

To prevent the power transistor 24 from going into saturation, the regulator controls the collector voltage in the following manner. The voltage level at the collector 25 is fed through appropriate dropping resistors where it is reduced to a level acceptable by a operational amplifier acting as a comparator. This collector voltage is compared with the base voltage level of the power transistor 24. When the base voltage is less than the collector voltage, the output level of the comparator is increased, increasing the conduction of transistor 54; therefore, the current through transistor 54 is increased and the entire input drive signal current is applied to the base 14 of transistor 16. As the collector voltage of transistor 24 approaches the base voltage, the output signal from the comparator decreases in value causing transistor 54 to reduce conduction, thereby reducing the current through the transistor. This reduced current causes a reduction of voltage level at base 14 resulting in lowering the conduction of transistor 16 which in turn lowers the base voltage on transistor 24, reducing its conductivity and increasing the collector voltage level. The feed back control provides a dynamic control of the saturation of the power output transistor.

DESCRIPTION OF THE OPERATION OF THE FOURTH EMBODIMENT

The purpose of the regulator is to prevent the collector voltage of the power transistor 24 from reducing to a value less than the voltage at the base thereby preventing saturation of the transistor.

The regulator and the circuit to be regulated are powered in a conventional manner by the application of voltages to the various components at levels typical for their normal operation.

In normal operation without base drive regulation a signal is applied to the resistor 12. A typical signal would be a positive going square wave signal of constant or varying frequency. As the input signal goes positive, the positive signal is applied to the base element 14 of the first transistor 16 causing transistor 16 to conduct positive voltages from its collector to its emitter at a level corresponding to the input level on base 14. The positive signal on emitter 20 is likewise present at the base 22 of the power transistor 24. This voltage causes current to flow through load 26 from the positive supply through the collector 25 and emitter 28 of transistor 24 to the negative supply or common. As transistor 24 conducts, the voltage level at the collector 25 decreases according to the conduction level of the transistor 24. As the voltage on the base 22 increases, the voltage on collector 25 decreases. When the base drive increases to a maximum level, the voltage on collector 25 approaches zero thereby driving the transistor 24 well into saturation.

To prevent the power transistor 24 from going into saturation, the regulator controls the collector voltage in the following manner. The voltage level at the collector 25 is fed through appropriate dropping resistors where it is reduced to a level acceptable by an operational amplifier acting as a comparator. This collector voltage is compared with the base voltage level of the power transistor 24. When the base voltage is less than the collector voltage, the output level of the comparator is increased to turn on transistor 54; therefore, the conduction through transistor 54 is increased and the entire positive collector supply voltage to transistor 54 is applied to the collector 18 of transistor 16 which supplied current to the base 14 of transistor 16. As the collector voltage of transistor 24 approaches the base voltage, the output signal from the comparator decreases in value causing transistor 54 to reduce conduction, thereby reducing current through the transistor. This reduced current causes a reduction of voltage level at base 14 resulting in lowering the conduction of transistor 16 which in turn lowers the base voltage on transistor 24, reducing its conductivity and increasing the collector voltage level. The feed back control provides a dynamic control of the saturation of the power output transistor.

DESCRIPTION OF THE OPERATION OF THE FIFTH EMBODIMENT

The purpose of the regulator is to prevent the collector voltage of the power transistor 24 from reducing to a value less than the voltage at the base thereby preventing saturation of the transistor.

The regulator and the circuit to be regulated are powered in a conventional manner by the application of voltages to the various components at level typical for the normal operation.

In normal operation without base drive regulation a signal is applied to the resistor 12. A typical signal would be a positive going square wave signal of constant or varying frequency. As the input signal goes positive, the positive signal is applied to the base element 14 of the first transistor 16 causing transistor 16 to conduct positive voltages from its collector to its emitter at a level corresponding to the input level on base 14. The positive signal on emitter 20 is likewise present at the base 22 of the power transistor 24. This voltage causes current to flow through load 26 from the positive supply through the collector 25 and emitter 28 or transistor 24 to the negative supply or common. As transistor 24 conducts, the voltage level at the collector 25 decreases according to the conduction level of the transistor 24. As the voltage on the base 22 increases, the voltage on collector 25 decreases. When the base drive increases to a maximum level, the voltage on collector 25 approaches zero thereby driving the transistor 24 well into saturation.

To prevent the power transistor 24 from going into saturation, the regulator controls the collector voltage in the following manner. The voltage level at the collector 25 is fed through appropriate dropping resistor where it is reduced to a level acceptable by an operational amplifier acting as a comparator. This collector voltage is compared with the base voltage level of the power transistor 24. When the base voltage is less than the collector voltage, the output level of the comparator is insufficient to turn on transistor 54; therefore, the path through transistor 54 is open and the entire input drive signal current is applied to the base 14 of transistor 16. As the collector voltage of transistor 24 approaches the base voltage, the output signal from the comparator increases in value causing transistor 54 to start to conduct, thereby providing a second current path through the transistor. This second current path causes a reduction of voltage level at emitter 20 resulting in diverting the conduction of transistor 16 through the transistor 54 which in turn lowers the base voltage on transistor 24, reducing its conductivity and increasing the collector voltage level. The feed back control provides a dynamic control of the saturation of the power output transistor.

We claim:

1. A base drive regulator for the output transistor of a switching amplifier comprising:
   means for monitoring the collector element voltage of said output transistor;
   a source of base drive voltage;
   a source of reference voltage, said source of reference voltage is the base element of said output transistor;
   means for comparing said collector element voltage and said reference voltage and producing a separate instantaneous output voltage level corresponding to any difference therebetween; and
   means for varying the level of said base drive voltage in response to said separate instantaneous, output voltage level for maintaining the conduction of said output transistor just at the edge of saturation wherein said base drive and collector element voltage levels are substantially equal during varying load conditions thereon.

2. The invention as defined in claim 1, wherein said means for monitoring said collector element voltage comprises a resistor divider network connected between said collector element and the emitter element of said output transistor.

3. The invention as defined in claim 1, wherein said source of reference voltage is a regulated voltage source.

4. The invention as defined in claim 1, wherein said means for comparing comprises a operational amplifier operating as a comparator.

5. A base drive regulator for the output transistor of a switching amplifier comprising:
   means for monitoring the collector element voltage of said output transistor;
   a source of base drive voltage;
   a source of reference voltage;
   means for comparing said collector element voltage and said reference voltage and producing a separate instantaneous output voltage level corresponding to any difference therebetween; and
   means for varying the level of said base drive voltage in response to said separate instantaneous, output voltage level for maintaining the conduction of said output transistor just at the edge of saturation wherein said base drive and collector element voltage levels are substantially equal during varying load conditions thereon;
   said means for varying the level of said base drive voltage level comprises at least one regulator transistor with its base element connected to the output of said means for comparing, its collector element connected to the base element of said output transistor and its emitter element connected to the emitter of said output transistor.

6. A base drive regulator for the output transistor of a switching amplifier comprising:
   means for monitoring the collector element voltage of said output transistor;
   a source of base drive voltage;
   a source of reference voltage;
   means for comparing said collector element voltage and said reference voltage and producing a separate instantaneous output voltage level corresponding to any difference therebetween; and
   means for varying the level of said base drive voltage in response to said separate instantaneous, output voltage level for maintaining the conduction of said output transistor just at the edge of saturation wherein said base drive and collector element voltage levels are substantially equal during varying load conditions therein;
   said means for varying the level of said base drive voltage comprises at least two transistors, a regulator transistor having its base element connected to the output of said means for comparing, its collector element connected to a power source and its emitter element connected to the collector element of a drive transistor, the emitter element of said drive transistor connected to the base element of said output transistor and its base element connected to an input signal to be amplified.

7. A base drive regulator for the output transistor of a switching amplifier comprising:
   means for monitoring the collector element voltage of said output transistor;
   a source of base drive voltage;
   a source of reference voltage;
   means for comprising said collector element voltage and said reference voltage and producing a separate instantaneous output voltage level corresponding to any difference therebetween; and
   means for varying the level of said base drive voltage in response to said separate instantaneous, output voltage level for maintaining the conduction of said output transistor just at the edge of saturation wherein said base drive and collector element voltage levels are substantially equal during varying load conditions therein;
   said means for varying level of said base drive voltage comprises at least two transistors, a regulator transistor having its base element connected to the output of said means for comparing, its collector element connected to an input signal to be amplified and its emitter element connected to the base element of a drive transistor, said drive transistor having its collector element connected to a power source and its emitter element connected to the base element of said power transistor.

8. A base drive regulator for the output transistor of a switching amplifier comprising:
   means for monitoring the collector element voltage of said output transistor;
   a source of base drive voltage;
   a source of reference voltage;
   means for comparing said collector element voltage and said reference voltage and producing a separate instantaneous output voltage level corresponding to any difference therebetween; and
   means for varying the level of said base drive voltage in response to said separate instantaneous, output voltage level for maintaining the conduction of said output transistor just at the edge of saturation wherein said base drive and collector element voltage levels are substantially equal during varying load conditions thereon;
   said means for varying the level of said base drive voltage comprises at least two transistors, a regulator transistor having its base element connected to the output of said means for comparing, its collector element connected to the emitter element of a drive transistor and its emitter element connected to the emitter element of said output transistor, said drive transistor having its base element connected to an input signal to be amplified, it emitter element connected to the base element of said output transistor.

9. A base drive regulator for the output transistor of a switching amplifier comprising:
   means for monitoring the collector element voltage of said output transistor;
   a source of base drive voltage;
   a source of reference voltage;
   means for comparing said collector element voltage and said reference voltage and producing a separate instantaneous output voltage level corresponding to any difference therebetween; and
   means for varying the level of said base drive voltage in response of said separate instantaneous, output voltage level for maintaining the conduction of said output transistor just at the edge of saturation wherein said base drive and collector element voltage levels are substantially equal during varying load conditions thereon;
   said means for varying the level of said base drive voltage comprises at least two transistors, a regulator transistor having its base element connected to the output of said means for comparing, its collector element connected to said source of base drive voltage and the base element of a drive transistor and its emitter element connected to the emitter element of said output transistor, the emitter element of said drive transistor connected to the base of said output transistor and its collector element is connected to a power source.

10. The invention as defined in claim 9, wherein said source of reference voltage is the base of said output transistor.

11. The invention as defined in claim 9, wherein said source of reference voltage is the supply voltage negative potential.

* * * * *